(12) United States Patent
Mobin et al.

(10) Patent No.: US 8,798,222 B2
(45) Date of Patent: Aug. 5, 2014

(54) METHODS AND APPARATUS FOR DIGITAL LINEARIZATION OF AN ANALOG PHASE INTERPOLATOR

(75) Inventors: Mohammad S. Mobin, Orefield, PA (US); Gregory W. Sheets, Bangor, PA (US); Lane A. Smith, Easton, PA (US); Craig B. Ziemer, Fleetwood, PA (US)

(73) Assignee: Agere Systems LLC, San Jose, CA (US)

( * ) Notice: Subject to any disclaimer, the term of this patent is extended or adjusted under 35 U.S.C. 154(b) by 1285 days.

(21) Appl. No.: 11/095,770

(22) Filed: Mar. 31, 2005

(65) Prior Publication Data

US 2006/0222135 A1 Oct. 5, 2006

(51) Int. Cl.
*H04L 7/00* (2006.01)

(52) U.S. Cl.
USPC ........... 375/371; 327/141; 358/409; 713/400; 714/12

(58) Field of Classification Search
USPC ........... 375/371; 327/141; 358/409; 713/400; 714/12
See application file for complete search history.

(56) References Cited

U.S. PATENT DOCUMENTS

| | | | | |
|---|---|---|---|---|
| 6,133,773 | A | * | 10/2000 | Garlepp et al. ............... 327/247 |
| 7,613,266 | B1 | * | 11/2009 | Talbot ........................ 375/371 |
| 2002/0036526 | A1 | * | 3/2002 | Nakamura .................. 327/158 |
| 2006/0140321 | A1 | * | 6/2006 | Tell et al. ..................... 375/376 |

OTHER PUBLICATIONS

Weinlader et al., "An Eight Channel 36GSample/s CMOS Timing Analyzer," 2000 IEEE International Solid-State Circuits Conference, 07803-5853-8/00 (2000).
Sidiropoulos et al., "A Semidigital Dual Delay-Locked Loop," IEEE Journal of Solid State Circuits, vol. 32, No. 11, pp. 1683-1692 (1997).

* cited by examiner

*Primary Examiner* — Zewdu Kassa
(74) *Attorney, Agent, or Firm* — Ryan, Mason & Lewis, LLP

(57) ABSTRACT

Methods and apparatus are provided for digital linearization of an analog phase interpolator. Up to $2^N$ desired phase values are mapped to a corresponding M bit value, where M is greater than N. A corresponding M bit value is applied to the phase interpolator to obtain a desired one of the $2^N$ desired phase values. A linearized phase interpolator is also provided that accounts for process, voltage, temperature or aging (PVTA) variations.

15 Claims, 4 Drawing Sheets

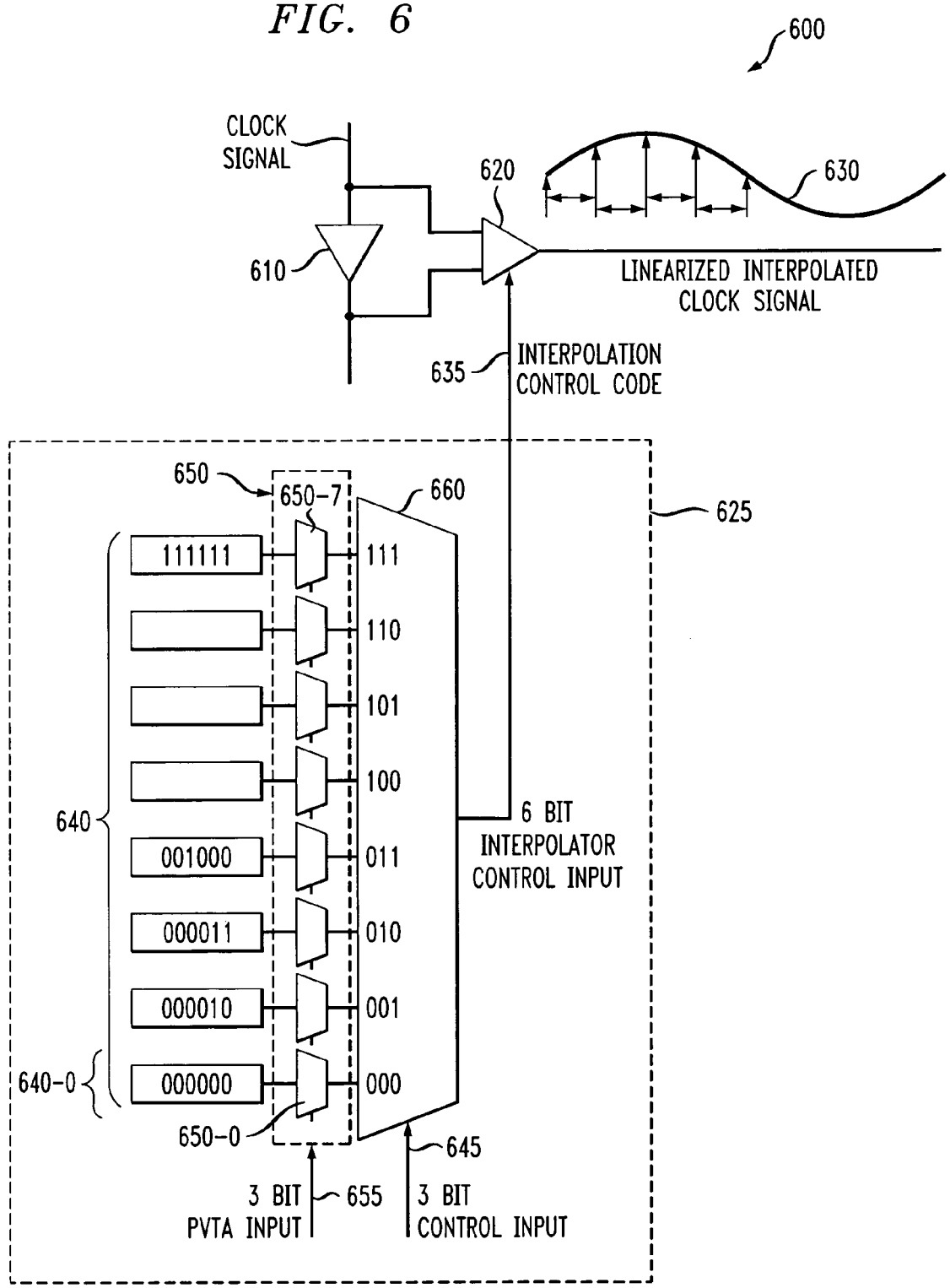

ered in the above description. It is to be understood that the embodiments and variations shown and described herein are merely illustrative of the principles of this invention and that various modifications may be implemented by those skilled in the art.

METHODS AND APPARATUS FOR DIGITAL LINEARIZATION OF AN ANALOG PHASE INTERPOLATOR

FIELD OF THE INVENTION

The present invention is related to techniques for clock and data recovery (CDR) techniques and, more particularly, to techniques for improving the linearity of phase interpolators.

BACKGROUND OF THE INVENTION

In many applications, including digital communications, clock and data recovery (CDR) must be performed before data can be decoded. Generally, in a digital clock recovery system, a reference clock signal of a given frequency is generated together with a number of different clock signals having the same frequency but with different phases. In one typical implementation, the different clock signals are generated by applying the reference clock signal to a delay network. Thereafter, one or more of the clock signals are compared to the phase and frequency of an incoming data stream and one or more of the clock signals are selected for data recovery.

A number of existing digital CDR circuits use one or more analog phase interpolators to generate a clock signal of a desired phase between the phase of two input signals. It has been found that most analog phase interpolators demonstrate a non-linear phase output in response to a control input. This, in turn, adversely affects the performance of the CDR circuit. The interpolator non-linearity is often attributed to variations in process, voltage, temperature or aging (PVTA).

A need therefore exists for improved techniques for interpolating two input clock signals to generate a clock signal having a phase between the phase of the two input clock signals. A further need exists for improved techniques for linearizing the phase output of an analog interpolator in response to a control input.

SUMMARY OF THE INVENTION

Generally, methods and apparatus are provided for digital linearization of an analog phase interpolator. According to one aspect of the invention, up to $2^N$ desired phase values are mapped to a corresponding M bit value, where M is greater than N. Thereafter, a corresponding M bit value is applied to the phase interpolator to obtain a desired one of the $2^N$ desired phase values. An M bit value corresponding to a given one of the $2^N$ desired phase values can be stored in a storage element indexed by an N bit value. The mapping of M bit values to N bit values is obtained by evaluating a plurality of phases of an interpolated clock signal generated by the phase interpolator as a function of a plurality of applied interpolation control codes.

According to another aspect of the invention, a linearized phase interpolator is provided that can account for process, voltage, temperature or aging (PVTA) variations. Thus, for each of a plurality of possible PVTA conditions, up to $2^N$ desired phase values are mapped to a corresponding M bit value, where M is greater than N. A mapping is then selected for a current PVTA condition, and based on the selected mapping, a corresponding M bit value is applied to the phase interpolator to obtain a desired one of the $2^N$ desired phase values.

A more complete understanding of the present invention, as well as further features and advantages of the present invention, will be obtained by reference to the following detailed description and drawings.

BRIEF DESCRIPTION OF THE DRAWINGS

FIG. 6 is a schematic block diagram of an alternative linearized phase interpolator incorporating features of the present invention to account for process, voltage, temperature or aging (PVTA) variations.

DETAILED DESCRIPTION

Figure 1:
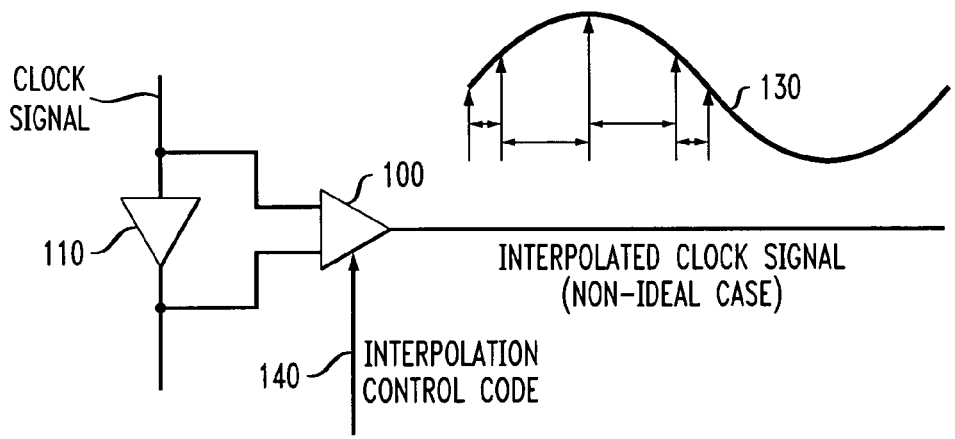
FIG. 1 is a schematic block diagram of a conventional phase interpolator.

The present invention provides methods and apparatus for digital linearization of an analog phase interpolator. FIG. 1 is a schematic block diagram of a conventional phase interpolator 100. As shown in FIG. 1, an input clock signal is applied to a delay stage 110 to generate two phase offset clock signals that are applied to the input of the analog phase interpolator 100. The input clock signal may be generated, for example, by a local voltage controlled oscillator (VCO) or a voltage controlled delay loop (VCDL). The analog phase interpolator 100 generates an interpolated clock signal 130 having a desired phase in response to an interpolation control code 140, in a known manner.

Figure 2:
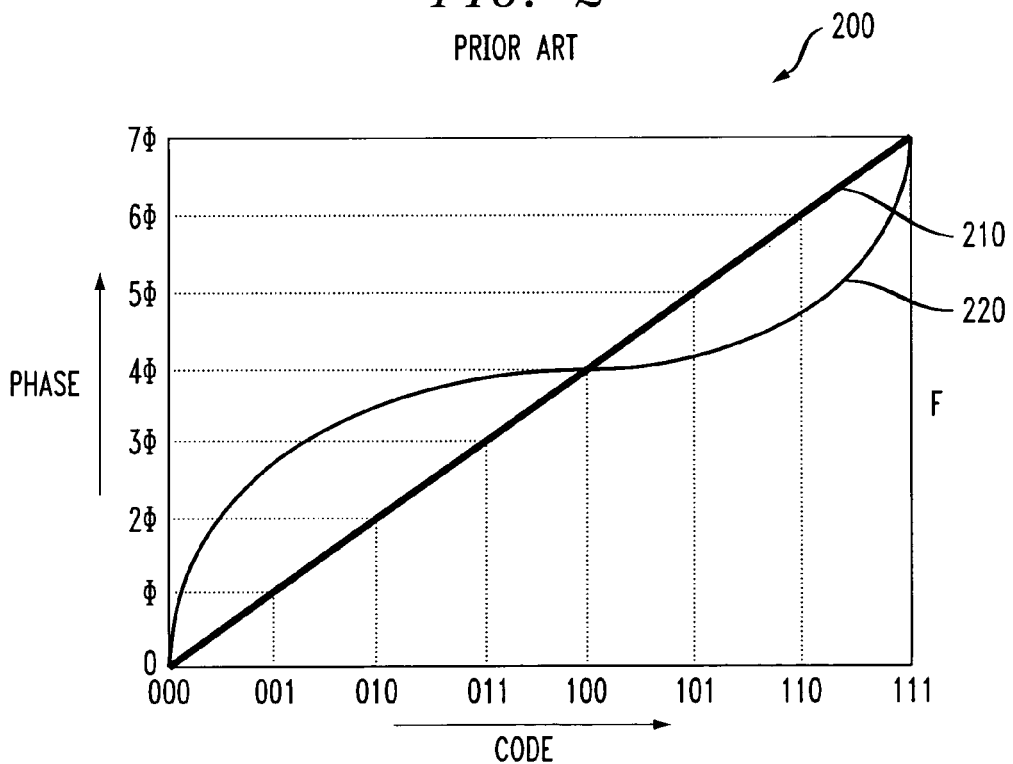
FIG. 2 is a characteristic curve illustrating the phase of the interpolated clock signal of FIG. 1 as a function of the applied interpolation control code.

FIG. 2 is a characteristic curve 200 illustrating the phase of the interpolated clock signal 130 of FIG. 1 as a function of the applied interpolation control code 140. As shown in FIG. 2, while it desired for the analog phase interpolator 100 to exhibit the ideal linear characteristic curve 210, an analog phase interpolator 100 will typically demonstrate a non-linear characteristic curve 220. For example, for an interpolation control code 140 of 011, it is desired that the analog phase interpolator 100 generates an interpolated clock signal 130 having a phase of 3Φ. Similarly, for an interpolation control code 140 of 101, it is desired that the analog phase interpolator 100 generates an interpolated clock signal 130 having a phase of 5Φ.

Figure 3:
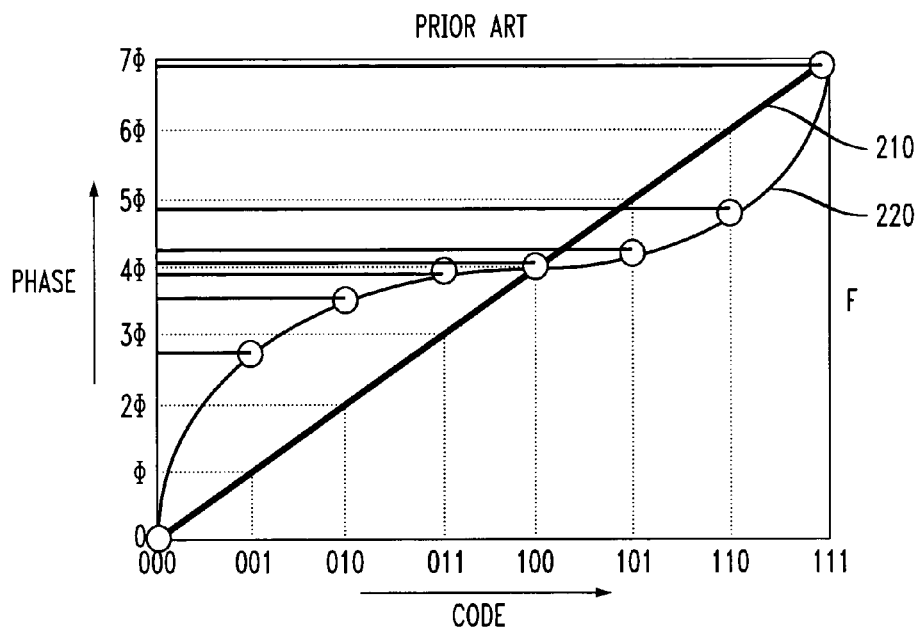
FIG. 3 illustrates the non-linear phase of the interpolated clock signal of FIG. 1 for each applied interpolation control code.

As shown more clearly in FIG. 3, however, for an interpolation control code 140 of 011, the analog phase interpolator 100 actually generates an interpolated clock signal 130 having a phase closer to 4Φ (as opposed to 3Φ). Similarly, for an interpolation control code 140 of 101, the analog phase interpolator 100 actually generates an interpolated clock signal 130 having a phase just above 4Φ (as opposed to 5Φ).

Figure 4:
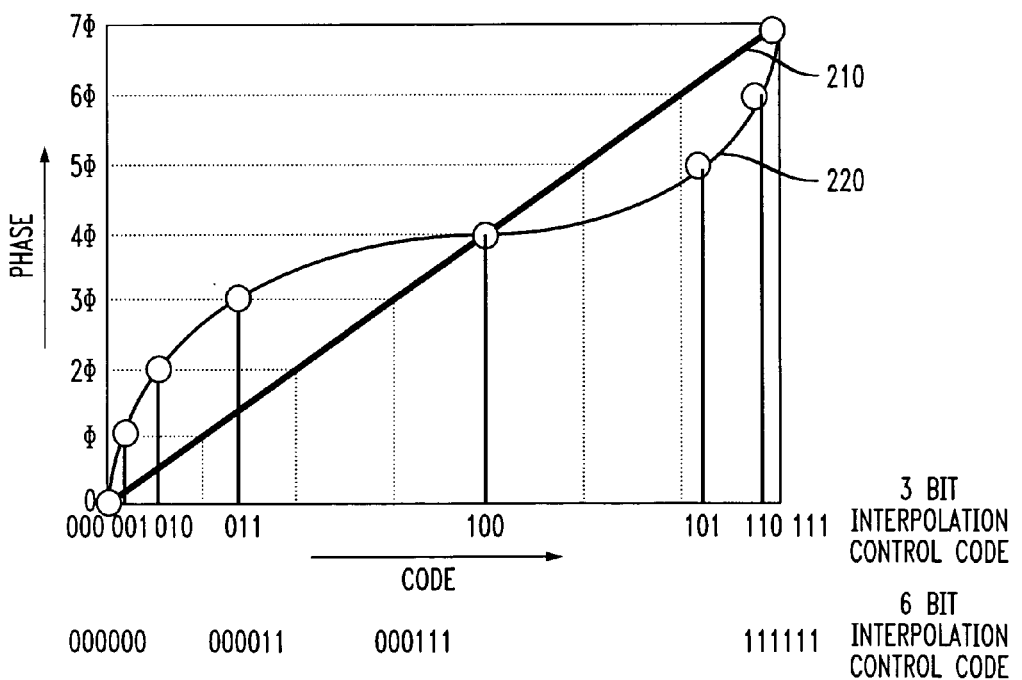
FIG. 4 illustrates the mapping of the desired phase of the interpolated clock signal to the corresponding interpolation control code according to the linearization of the present invention.

The present invention recognizes that the analog phase interpolator 100 can be linearized by employing an oversampled phase interpolator and then selecting the desired phase through code mapping. FIG. 4 illustrates the mapping of the desired phase of the interpolated clock signal to the corresponding interpolation control code. As shown in FIG. 4, the 3 bit interpolation control code is mapped, for example, to a corresponding 6 bit interpolation control code that controls an over-sampled phase interpolator. For example, to obtain an interpolated clock signal having a phase of 2Φ, a 6 bit interpolation control code (000011) corresponding to 010 should be applied to the analog phase interpolator 100. Likewise, to obtain an interpolated clock signal having a phase of 6Φ, a 6 bit interpolation control code corresponding to 110 should be applied to the analog phase interpolator 110.

Figure 5:
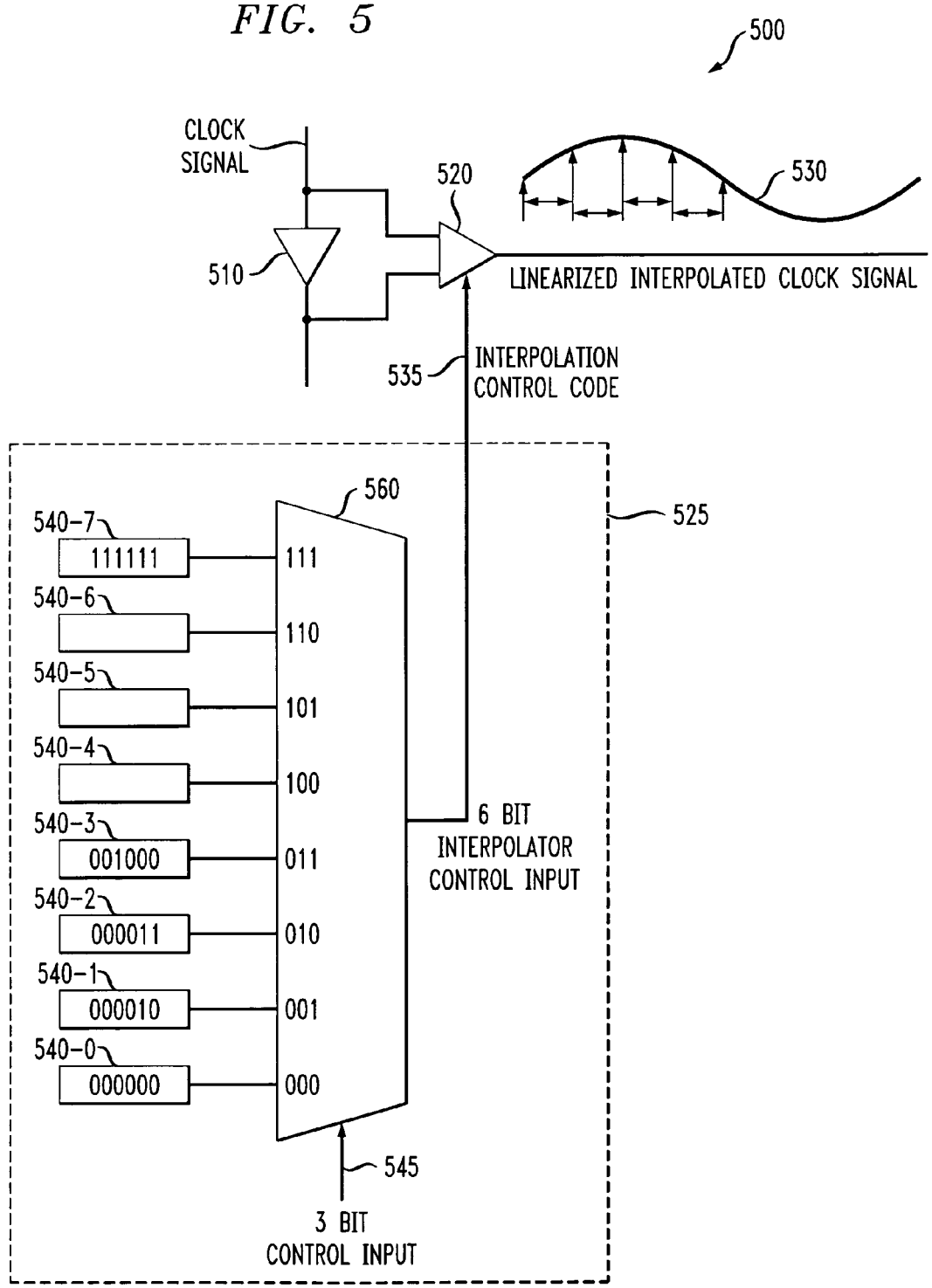
FIG. 5 is a schematic block diagram of a linearized phase interpolator incorporating features of the present invention.

FIG. 5 is a schematic block diagram of a linearized phase interpolator 500 incorporating features of the present invention. As shown in FIG. 5, an input clock signal is applied to a delay stage 510 to generate two phase offset clock signals that are applied to the inputs of the analog phase interpolator 520, in the same manner as FIG. 1. The linearized phase interpolator 500 includes an exemplary code mapper circuit 525 that maps the desired phase of the interpolated clock signal 530 to the corresponding 6 bit interpolation control code. As shown in FIG. 5, the code mapper circuit 525 includes a multiplexer 560 that is indexed by a 3 bit control input 545. The 3 bit value corresponding to a desired phase is applied to the multiplexer 560 and the corresponding 6 bit value is obtained from a storage element 540 that is selected by the multiplexer 560.

For example, to obtain an interpolated clock signal 530 having a phase of 2Φ, the code mapper circuit 525 should generate a 6 bit interpolation control code 535 of 000011 that is applied to the analog phase interpolator 520. In particular, to obtain an interpolated clock signal 530 having a phase of 2Φ, the corresponding 3 bit value of 010 is applied to the multiplexer 560, and the multiplexer 560 retrieves the corresponding 6 bit interpolation control code of 000011 that is stored in storage element 540-2.

Likewise, to obtain an interpolated clock signal 530 having a phase of 6Φ, the code mapper circuit 525 should generate a 6 bit interpolation control code 535 that corresponds to the 3 bit code 010. In particular, to obtain an interpolated clock signal 530 having a phase of 6Φ, the corresponding 3 bit value of 10 is applied to the multiplexer 560, and the multiplexer 560 retrieves the corresponding 6 bit interpolation control code that is stored in storage element 540-6.

FIG. 6 is a schematic block diagram of an alternative linearized phase interpolator 600 incorporating features of the present invention to account for process, voltage, temperature or aging (PVTA) variations. In the embodiment of FIG. 6, characteristic curve of the phase interpolator is evaluated under various PVTA conditions. In particular, for each PVTA condition, a mapping is obtained that maps the 3 bit interpolation control code, for example, to a corresponding 6 bit interpolation control code that controls an over-sampled phase interpolator.

Thus, in the exemplary implementation shown in FIG. 6, the code mapper circuit 625 provides an additional level of code mapping that allows the PVTA variations to be addressed. A second set of multiplexers 650 is indexed by, for example, a 3 bit PVTA code 655 that characterizes the current PVTA conditions. The 3 bit PVTA code 655 can be applied to each multiplexer, such as multiplexer 650-0, in the second set of multiplexers 650. It is noted that PVTA conditions can be obtained using one or more well known techniques.

Each multiplexer 650-i in the set of multiplexers 650 selects the appropriate 6 bit interpolator control code from a corresponding storage element 640-i, based on the the 3 bit PVTA code. In an implementation where the PVTA code is a 3 bit value, each multiplexer 650-i selects a value from one of eight storage elements 640-i. For example, multiplexer 650-0 selects a 6 bit value from one of eight storage elements 640-0 (there would be 8 individual storage elements 640-0 that are applied to multiplexer 650-0 although only one is shown in FIG. 6 for ease of illustration). In this manner, the set of multiplexers 650 presents the appropriate 6-bit to 3-bit mapping for the current PVTA condition.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. A method for linearizing a phase interpolator, comprising:

obtaining a mapping of up to $2^N$ desired phase values to a corresponding M bit value, wherein a subset of said M bit values are mapped to a corresponding N bit value;

identifying an M bit value corresponding to a desired phase value;

determining an N bit value that is mapped to said identified M bit value, where M is a value greater than N;

applying said determined N bit value to a selector indexed by said N bit value to obtain said identified M bit value;

and applying said identified M bit value to said phase interpolator to obtain said desired one of said $2^N$ desired phase values wherein said phase interpolator is an over-sampled phase interpolator; wherein said obtaining step further comprises the step of evaluating a plurality of phases of an interpolated clock signal generated by said phase interpolator as a function of a plurality of applied interpolation control codes.

2. The method of claim 1, further comprising the steps of:

obtaining, for each of a plurality of process, voltage, temperature or aging (PVTA) conditions, a mapping of up to $2^N$ desired phase values to a corresponding M bit value, where M is greater than N;

selecting a mapping for a current PVTA condition; and based on said selected mapping, applying a corresponding M bit value to said phase interpolator to obtain a desired one of said $2^N$ desired phase values.

3. The method of claim 1, wherein an M bit value corresponding to a given one of said $2^N$ desired phase values is stored in a storage element indexed by an N bit value.

4. The method of claim 1, wherein said phase interpolator generates a signal having a desired phase between a phase of two applied input signals.

5. The method of claim 1, wherein said obtaining step further comprises the step of determining, for each of up to $2^N$ desired phase values, an M bit input value that generates said desired phase value.

6. A linearized phase interpolator, comprising:

a plurality of storage elements each storing an M bit value corresponding to one of up to $2^N$ desired phase values, where M is a value greater than N, wherein a subset of said M bit values are mapped to a corresponding N bit value; and a selector indexed by an N bit value for selecting one of said storage elements storing a particular M bit value corresponding to a desired one of said $2^N$ desired phase values, wherein said selected corresponding M bit value is applied to a control input of said linearized phase interpolator to obtain a said desired one of said 2N desired phase values, wherein said phase interpolator is an over-sampled phase interpolator;

wherein said M bit values are obtained by evaluating a plurality of phases of an interpolated clock signal generated by said phase interpolator as a function of a plurality of applied interpolation control codes.

7. The linearized phase interpolator of claim 6, wherein said selector is a multiplexer.

8. The linearized phase interpolator of claim 6, further comprising:
   a plurality of sets of storage elements each storing an M bit value corresponding to one of up to $2^N$ desired phase values, where M is greater than N and where each set corresponds to a different process, voltage, temperature or aging (PVTA) condition; and
   a selector for selecting a mapping for a current PVTA condition.

9. The linearized phase interpolator of claim 6, wherein an M bit value corresponding to a given one of said $2^N$ desired phase values is stored in a storage element indexed by an N bit value.

10. The linearized phase interpolator of claim 6, wherein said phase interpolator generates a signal having a desired phase between a phase of two applied input signals.

11. An integrated circuit, comprising: a linearized phase interpolator, comprising: a plurality of storage elements each storing an M bit value corresponding to one of up to $2^N$ desired phase values, where M is a value greater than N, wherein a subset of said M bit values are mapped to a corresponding N bit value; and a selector indexed by an N bit value for selecting one of said storage elements storing a particular M bit value corresponding to a desired one of said $2^N$ desired phase values, wherein said selected corresponding M bit value is applied to a control input of said linearized phase interpolator to obtain a said desired one of said 2N desired phase values, wherein said phase interpolator is an oversampled phase interpolator; wherein said M bit values are obtained by evaluating a plurality of phases of an interpolated clock signal generated by said phase interpolator as a function of a plurality of applied interpolation control codes.

12. The integrated circuit of claim 11, wherein said selector is a multiplexer.

13. The integrated circuit of claim 11, wherein said linearized phase interpolator further comprises:
   a plurality of sets of storage elements each storing an M bit value corresponding to one of up to $2^N$ desired phase values, where M is greater than N and where each set corresponds to a different process, voltage, temperature or aging (PVTA) condition; and
   a selector for selecting a mapping for a current PVTA condition.

14. The integrated circuit of claim 11, wherein an M bit value corresponding to a given one of said $2^N$ desired phase values is stored in a storage element indexed by an N bit value.

15. The integrated circuit of claim 11, wherein said phase interpolator generates a signal having a desired phase between a phase of two applied input signals.

* * * * *